Jan. 12, 1971 B. F. ROTHSCHILD 3,554,878

PLATING TIN-LEAD ALLOY ON PRINTED CIRCUITS AND ELECTROLYTE THEREFOR

Filed July 2, 1968 5 Sheets-Sheet 1

INVENTOR.

BILL F. ROTHSCHILD

BY Howard A. Silber

ATTORNEY

Jan. 12, 1971 B. F. ROTHSCHILD 3,554,878

PLATING TIN-LEAD ALLOY ON PRINTED CIRCUITS AND ELECTROLYTE THEREFOR

Filed July 2, 1968 5 Sheets-Sheet 2

INVENTOR.
BILL F. ROTHSCHILD

BY Howard A. Silber

ATTORNEY

INVENTOR.
BILL F. ROTHSCHILD
BY Howard A. Silber
ATTORNEY

INVENTOR.
BILL F. ROTHSCHILD
BY Howard A. Silber
ATTORNEY

INVENTOR.
BILL F. ROTHSCHILD
BY
Howard A. Silber
ATTORNEY

United States Patent Office 3,554,878

Patented Jan. 12, 1971

3,554,878

PLATING TIN-LEAD ALLOY ON PRINTED CIRCUITS AND ELECTROLYTE THEREFOR

Bill F. Rothschild, Whittier, Calif., assignor to North American Rockwell Corporation Filed July 2, 1968, Ser. No. 741,957

Int. Cl. C23b 5/38, 5/40

U.S. Cl. 204—24 5 Claims

ABSTRACT OF THE DISCLOSURE

A high throwing power tin lead (solder) fluoborate plating bath. The bath has a very low total metal content, typically 15 to 30 grams per liter, and a high fluoboric acid content, typically 300 to 500 grams per liter. A small weight percentage of peptone, typically 2 to 10 grams per liter completes the solution. The inventive plating bath has a very high throwing power value, typically greater than 65, and permits substantially uniform thickness solder plating of printed wiring boards through holes having board thickness to hole diameter ratios of 5:1 or greater.

BACKGROUND OF THE INVENTION

(1) Field of the invention

The present invention relates to a high throwing power solder plating solution and more particularly to a tin lead fluoborate plating solution having very low total metal content and high acid content.

(2) Description of the prior art

In the production of electrical printed circuit board it is common to electro-plate the electrically conductive regions of the board with solder. Such a tin-lead coating facilitates the subsequent connection of electrical components such as resistors, transistors, integrated circuits and the like to the printed wiring board. Moreover, the increasing use of integrated circuits has necessitated utilization of multilayer printed wiring boards having solder plated through-holes for electrically connecting circuitry on the various layers of the board. Typically, today's electronic equipment may be of such complexity as to require boards having 4, 5, 6 or more layers of circuitry, interconnected by appropriately located, plated through-hole connections.

In the fabrication of multilayer boards having plated through-holes, a severe problem has arisen with respect to obtaining uniform solder deposition over the entire depth of the through-holes. Thus, in a board having a thickness to hole diameter ratio on the order of 4:1 or greater, it has been impossible to obtain a uniform thickness or composition of plated solder throughout the hole thickness using tin-lead plating baths in accordance with the prior art. Under typical conditions, the ratio of the solder thickness at the board surface to that in the interior of the hole may be as great as 10 to 1; even the best advertised multilayer boards have at least 2:1 difference in thickness between solder plated at the surface and within the hole. Moreover, the deposited solder composition often varied from 60% tin, 40% lead at the board surface to about 20% tin, 80% lead near the center of the hole. Of course, such non-uniformity of solder thickness and composition posed severe reliability problems for the boards. The thin, non-uniform solder layers within the holes often resulted intermittent electrical properties which showed up after extended use. Conversely, the occurrence of open electrical circuits was sufficiently common as to substantially reduce the manufacturing yield for such printed circuit boards.

Characteristic of all prior art solder plating bath was the use of a relatively high metal concentration. Thus, as described in section 22.3 of the standard text entitled, "Electro-Deposition of Alloys—Principles and Practice" by Abner Brenner, vol. II, Academic Press, 1963, most commercial tin-lead fluoborates electrodeposition baths typically had a metal content of about 100 grams per liter (about 0.5 M/liter). In fact, the lowest metal content solder plating bath reported by Brenner had a total metal content of 35–60 grams per liter. Typically, such prior art metal concentration solder baths exhibited very low values of throwing power, usually less than 20.

Some attempts have been made to increase the throwing power of prior art solder plating baths, and thereby to increase the ability of the baths to provide uniform deposited solder thickness on a non-uniformly shaped object. These attempts usually have involved employing additives in the plating bath, to improve both the throwing power and the quality of the deposit. Thus, as described on p. 8 of the cited Brenner text, additives such as wetting agents, sulfonated organic acids, glue, and resorcinol all have been employed. The use of a wetting agent is typified by U.S. Pat. No. 2,751,341 to Smart, who employs the tetra sodium salt of ethylene diamine acetic acid for this purpose. Similarly, the U.S. Pat. No. 2,734,025 to Roehl shows the use of organic additives such as the condensation product of ethylene oxide with beta naphthol to improve plate out characteristics. However, all these additives have had only limited effect on increasing the throwing power.

While some attempts have been made to improve throwing power and/or deposit quality and composition uniformity by employing other than fluoborate baths, these generally have been unsuccessful. For example, pyrophosphate baths are hard to control. Perchlorate baths tend to be explosive. Sulfonate baths are considerably more expensive than the widely accepted fluoborate baths.

The shortcomings of the prior art are overcome by utilizing the inventive lead-tin (solder) fluoborate plating bath. The inventive bath exhibits very high throwing power values, typically 60 and above, is inexpensive, and results in deposits of uniform composition and thickness even in multilayer board through-holes of greater than 5:1 board thickness to hole diameter ratio.

SUMMARY OF THE INVENTION

In accordance with the present invention there is provided a high throwing power tin-lead fluoborate bath. The bath comprises tin and lead, each as a fluoborate, the bath having a total metal content in an operating range of between 15 and 30 grams per liter. The bath also includes between 300 and 500 grams per liter of fluoboric acid, and 2 to 10 grams per liter of industrial peptone. Typically, the bath exhibits a throwing power on the order of 60 or above.

When operated at room temperature with mild agitation, and using a current density of between 10 and 25 amperes per square foot, excellent solder plating characteristics are obtained. For example, multilayer board through-holes having board thickness to hole diameter ratios of 5:1 or greater may be plated with the present soldering bath, the resultant plating being of substantially uniform thickness and composition throughout the hole depth.

Thus it is an object of the present invention to provide a high throwing power solder plating bath.

It is another object of the present invention to provide a high throwing power tin-lead electrodeposition solution.

Another object of the present invention it to provide a high throwing power tin-lead plating bath characterized by low total metal content.

Yet another object of the present invention is to provide a solder plating bath having a low metal concentration and high fluoboric acid content.

Still another object of the present invention is to provide a fluoroborate solder plating solution having a total metal content of less than 30 grams per liter, the bath having a high throwing power.

A further object of the present invention is to provide a tin-lead plating bath comprising not more than 30 grams per liter total metal content.

Yet a further object of the present invention is to provide a high throwing power solder plating bath useful for providing a uniform thickness, uniform composition solder coating on multilayer board through-holes.

BRIEF DESCRIPTION OF THE DRAWINGS

Still other objects, features, and attendant advantages of the present invention will become apparent to those skilled in the art from a reading of the following detailed description of the preferred embodiment constructed in accordance therewith, taken in conjunction with the accompanying drawings wherein.

DESCRIPTION OF THE PREFERRED EMBODIMENT

Figure 1:
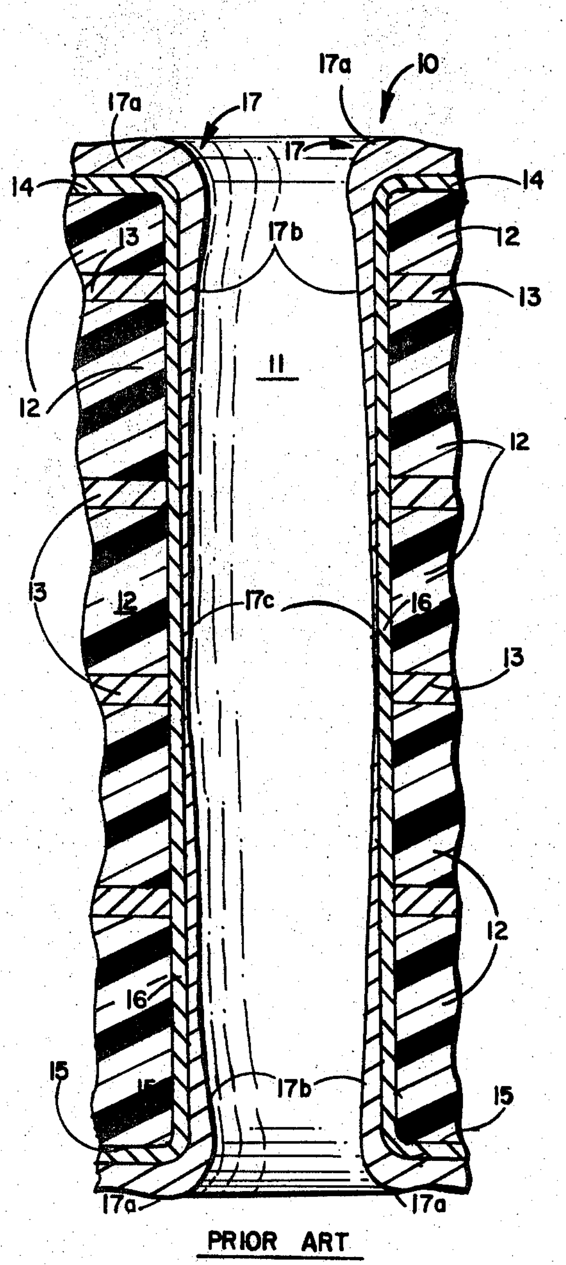
PRIOR ART FIG. 1
FIG. 1 is a greatly enlarged cross-sectional view of a typical through-hole in a multilayer printed circuit board, the hole having been solder plated utilizing a plating bath in accordance with the prior art.

Referring now to the drawings, and particularly to FIG. 1 thereof, there is shown a greatly enlarged cross-sectional view of a multilayer electronic circuit board 10 having a hole 11 extending completely therethrough. In the embodiment shown, board 10 comprises five electrically insulating layers, each layer being designated by the reference numeral 12. While illustrated as a five layer board, the invention is not so limited, and the inventive high throwing power solder bath may be used to plate circuit boards having any number of layers. Layers 12 are separated by electrically conductive regions 13 of copper or other material, fabricated in manners well known to those skilled in the printed circuit art.

Still referring to FIG. 1, the top and bottom outer surfaces 14 and 15 of board 10 adjacent hole 11, and the interior surface of hole 11 all are provided with a thin layer 16 of copper or the like. Layer 16 generally is provided by electroless deposition techniques and typically is of uniform thickness throughout the depth of hole 11. Disposed atop layer 16 is a solder layer 17 provided by conventional electrodeposition techniques from a solder plating bath in accordance with the prior art.

As evident in FIG. 1, the solder deposition (from a prior art plating bath) on the outer surfaces of board 10, such as the solder in regions **17*a* atop upper and lower circuit board surfaces 14 and 15, is thicker than the solder layer deposited on the interior surface of hole 11. Thus, the solder at regions 17*b* within hole 11 but near board outside surfaces 14 and 15 is somewhat thinner than at exterior regions 17*a*, but is thicker than the very thin deposit present near the center of hole 11, at region 17*c***.

The phenomenon illustrated is particularly acute in multilayer boards having board thickness to hole diameter ratios of 4:1 or greater. As a typical example, to plate a minimum of 0.001 cm. thick solder in through-holes of multilayer printed wiring boards having a hole length to diameter ratio of 5:1, 0.0051 to 0.0076 cm. of solder will deposit on the board surface, using conventional prior art plating baths.

Figure 2:
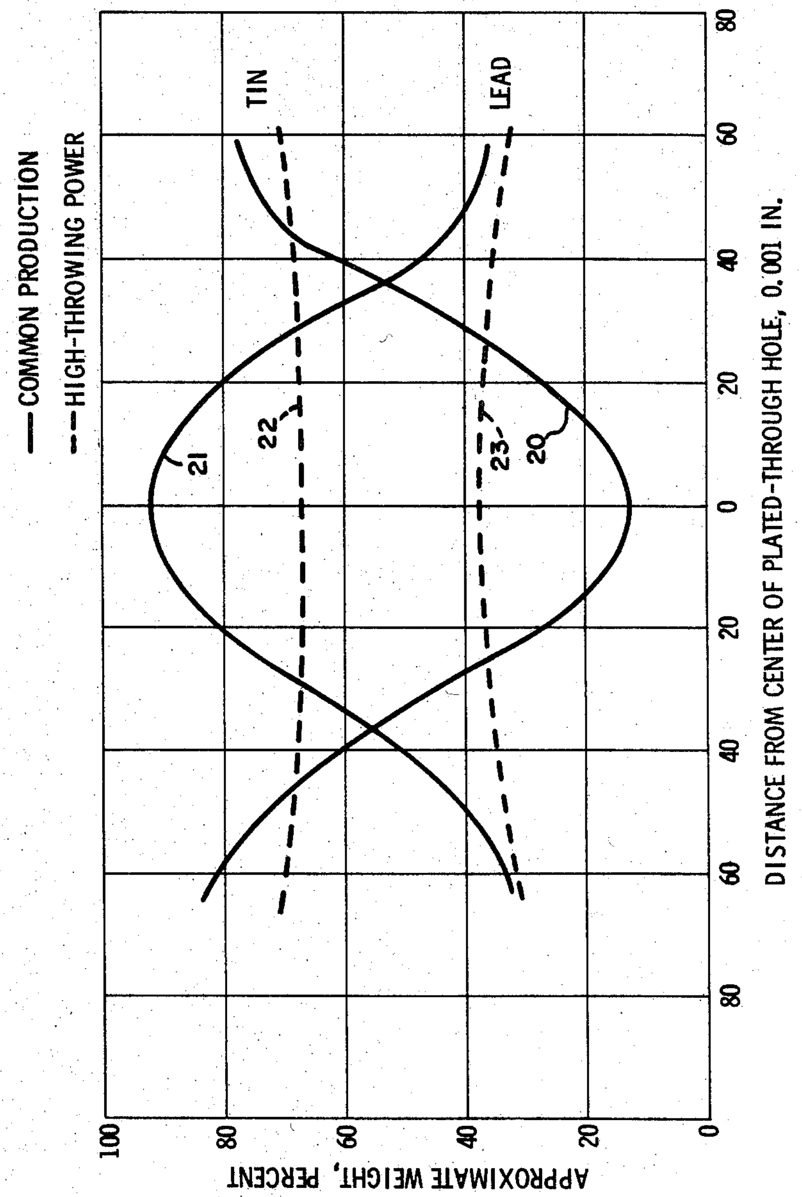
FIG. 2 is a graph showing the tin-lead composition variation as a function of distance from the center of solder plated multilayer board through-holes; characteristics for holes plated from prior art and from the inventive high throwing power solder plating baths are shown.

Although not apparent in FIG. 1, not only does the solder deposited within a multilayer board through-hole from a conventional deposition bath vary in thickness, the deposited solder also varies in composition. This characteristic is illustrated graphically by curves 20 and 21 of FIG. 2. Curves 20 and 21 show respectively the approximate weight percentages of tin and lead in solder layer 17 within multilayer board through-hole 11 shown in FIG. 1, as a function of distance from the center of the plated through-hole. As shown in FIG. 2, the weight percentage of tin (see curve 20) varied from a low of about 15% near the center of the hole to a high of about 80% adjacent the outer surfaces of the board. The weight percentage of lead (see curve 21) varied inversely as the tin, from a maximum of about 85% adjacent the center of the hole to a minimum of about 20% adjacent the outer surfaces of the board. This great variation in composition, wherein at certain hole depths there was more tin than lead, at other depths more lead than tin, resulted despite the use of a (prior art) plating bath in which the tin and lead concentration remained substantially uniform during the plating operation.

To overcome the prior art problem illustrated by FIG. 1 and curves 20 and 21 of FIG. 2, the inventive high throwing power, low metal concentration tin lead plating bath was developed. The following Table I lists the basic bath make up, including the acceptable operating range of the various ingredients. Example I, included in Table I, indicates the make-up of a preferred embodiment of the inventive bath.

TABLE I

| | Operating range, g./l. | Example I, g./l. |
|---|---|---|
| Tin ($Sn^{++}$) (as fluoborate) | 10-18 | 13.5 |
| Lead ($Pb^{++}$) (as fluoborate) | 5-12 | 9.0 |
| Total metal | 15-30 | 22.5 |
| Fluoboric acid | 300-500 | 460.0 |
| Peptone, industrial | 2-10 | 3.75 |

Figure 3:
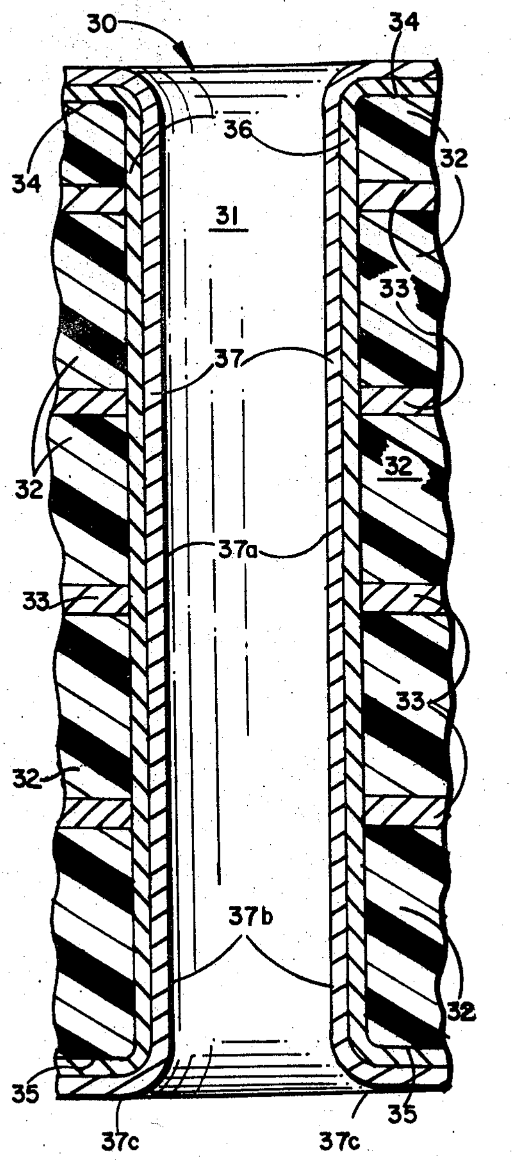
FIG. 3 is a greatly enlarged cross-sectional view of a typical through-hole in a multilayer electrical circuit board, the hole having been solder plated utilizing a high throwing power plating bath in accordance with the present invention.

Using a plating bath in accordance with the preferred composition listed as Example I in Table I, a printed circuit board otherwise identical to that of FIG. 1 was solder plated. A cross-sectional view of the resultant structure is shown in FIG. 3. As may be seen therein, circuit board 30 comprises hole 31 extending through insulating layers 32 separated by conductive layers 33. Extending between the upper board surface 34 and the lower board surface 35, is a layer of copper 36 or the like, the thickness of layer 36 being substantially uniform. A solder plating layer 37 deposited from a plating bath in accordance with the present invention overlays layer 36.

As may be seen in FIG. 3, the thickness of solder layer 37 is substantially uniform through hole 31, the thickness being approximately the same at the surface regions **37*a*, at the regions 37*b* within the hole 31 but near board outer surfaces 34 and 35, and at the region 37*c* adjacent the center of hole 31**.

Chemical analysis of the deposited solder layer 37 also indicated a very high uniformity of constituent metals in the deposit, as illustrated graphically by the dashed curves 22 and 23 of FIG. 2. Curves 22 and 23 respectively indicate the tin and lead approximately weight percentage of solder layer 37 deposited from a bath in accordance with the present invention. As may be seen in FIG. 2, the relative tin-lead concentration is almost uniform at all distances from the center of the plated through-hole. This is in significant contrast to the extreme variation in tin and lead weight percentage (as indicated by curves 20 and 21) representative of a through-hole plated with a solder bath in accordance with the prior art.

The inventive solder plating bath may be used at room temperature, preferably with mild agitation. Operating current densities in the range of 10 to 25 amperes per square foot are preferred. Although these current densities are significantly lower than required with prior art solder plating solutions, approximately the same or less time is required to deposit a like average thickness of solder in a multilayer through-hole with the inventive bath as with the conventional, prior art solder plating bath.

The throwing power of a plating solution may be measured using a Haring cell such as that described in the article by Haring and Bloom, "Transactions of the American Electrochemical Society," vol. 44, p. 313 (1923). The throwing power number T of a plating solution then is given by the following equation:

$$T=\frac{L-M}{L+M-2}\times 100 \qquad (1)$$

where L is the ratio of the far-to-near cathode to anode length of the Haring cell, and M is the ratio of the deposit weights of the near-to-far cathodes. When the compositions of the two deposits are different, the throwing power is determined using M as the ratio of moles of metal deposited on the near and far cathodes.

Using a Haring cell, the throwing power of the Example I plating solution (listing in Table I above) was found to be 80. For other plating bath compositions with the operating ranges listed in Table I, throwing power values in the range of 50 to 90 were measured.

Figure 4:
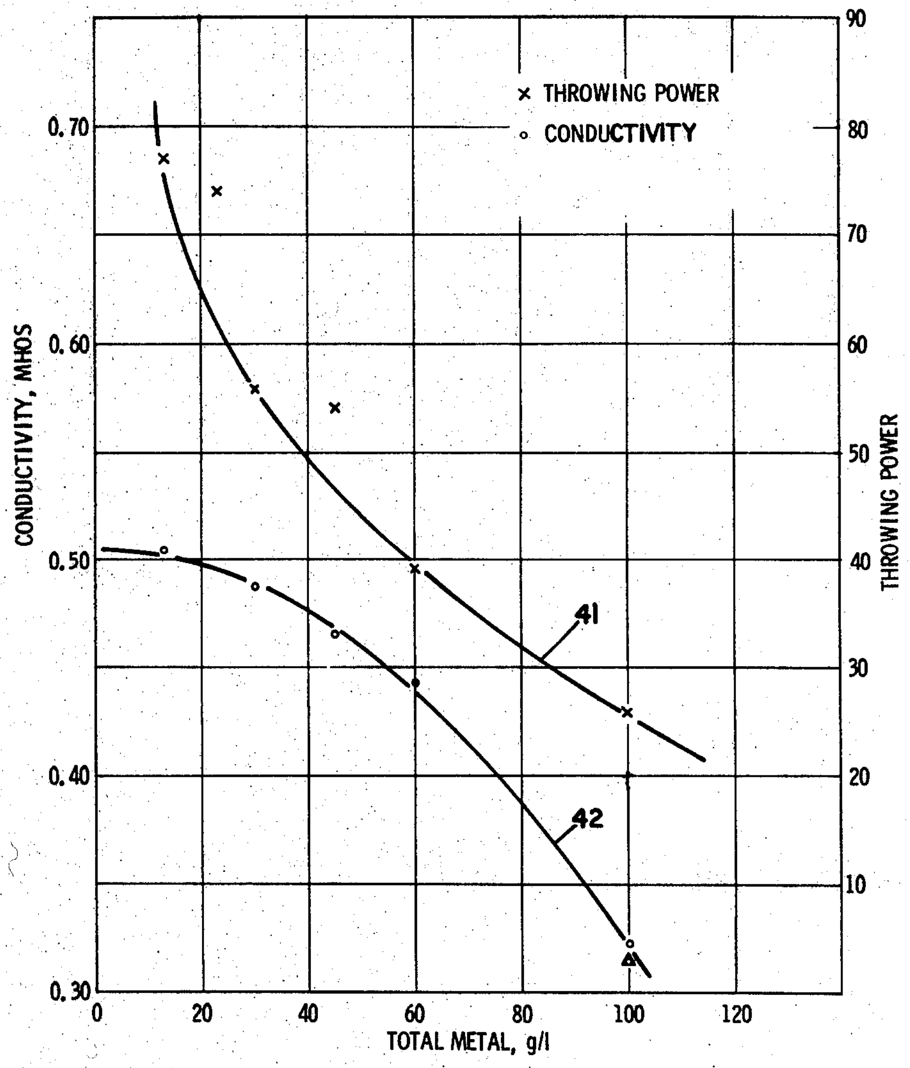
FIG. 4 is a graph showing conductivity and throwing power as a function of total metal content of a solder plating bath.

The effect of total metal concentration on the plating solution throwing power and conductivity was investigated by maintaining the fluoboric acid and peptone concentration constant and varying the total metal concentration. The measured throwing power and conductivity as a function of total metal concentration are shown respectively by curves 41 and 42 of FIG. 4. As represented thereby, the throwing power generally was found to increase as the total metal concentration decreased. Some increase in conductivity also occurred with decreasing metal concentration, indicating that the total metal concentration controls the throwing power in part through changes in solution conductance.

Figure 5:
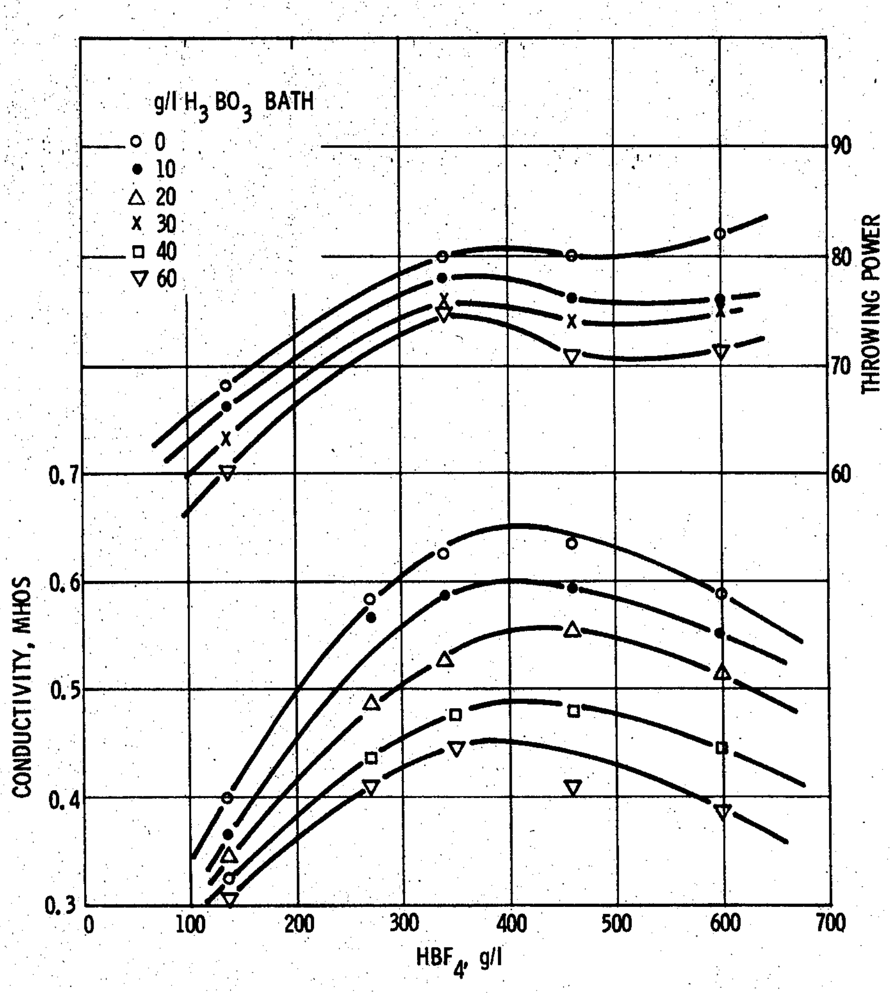
FIG. 5 is a graph of conductivity and throwing power as a function of fluoboric acid concentration in a solder plating bath.

Similar experiments were run to determine the effect of fluoboric acid concentration on the plating solution conductivity and throwing power. As illustrated in FIG. 5, as the fluoboric acid increases to about 400 grams per liter, the specific conductance of the solution and the throwing power increase. From about 400 to 500 grams per liter of fluoboric acid, the conductance and throwing power decrease. At greater than 500 grams per liter, the conductance of the solution continues to decrease but the throwing power increases. Comparison of deposit weights of the Haring cell cathodes show less weight on the near cathode with increasing fluoboric acid concentration above about 500 grams per liter. The far cathode weight did not vary appreciably, implying a departure from 100 percent cathode efficiency at the near cathodes. Thus, up to about 500 grams per liter the fluoboric acid concentration effects throwing power by virtue of its effect on conductance. Above this concentration the decreasing current efficiency at the near cathode begins to play a role and offsets the effect of decreasing conductance, causing a rise in throwing power. While the decrease in efficiency yielded higher throwing power, it also caused unsound deposits. Therefore, the higher concentration of fluoboric acid is not used. Fluoboric acid concentration had little effect on deposit composition.

Note that the family of curves presented in FIG. 5 represent different concentrations of boric acid ($H_3BO_3$) in the plating bath. Boric acid, while not required in the inventive plating bath, may be added in small quantity (preferably less than 40 g./l.) to the inventive solder plating bath to repress metal fluoborate hydrolysis. However, the absence of boric acid will not cause any deterioration of the inventive plating bath even after long periods of operation.

Figure 6:
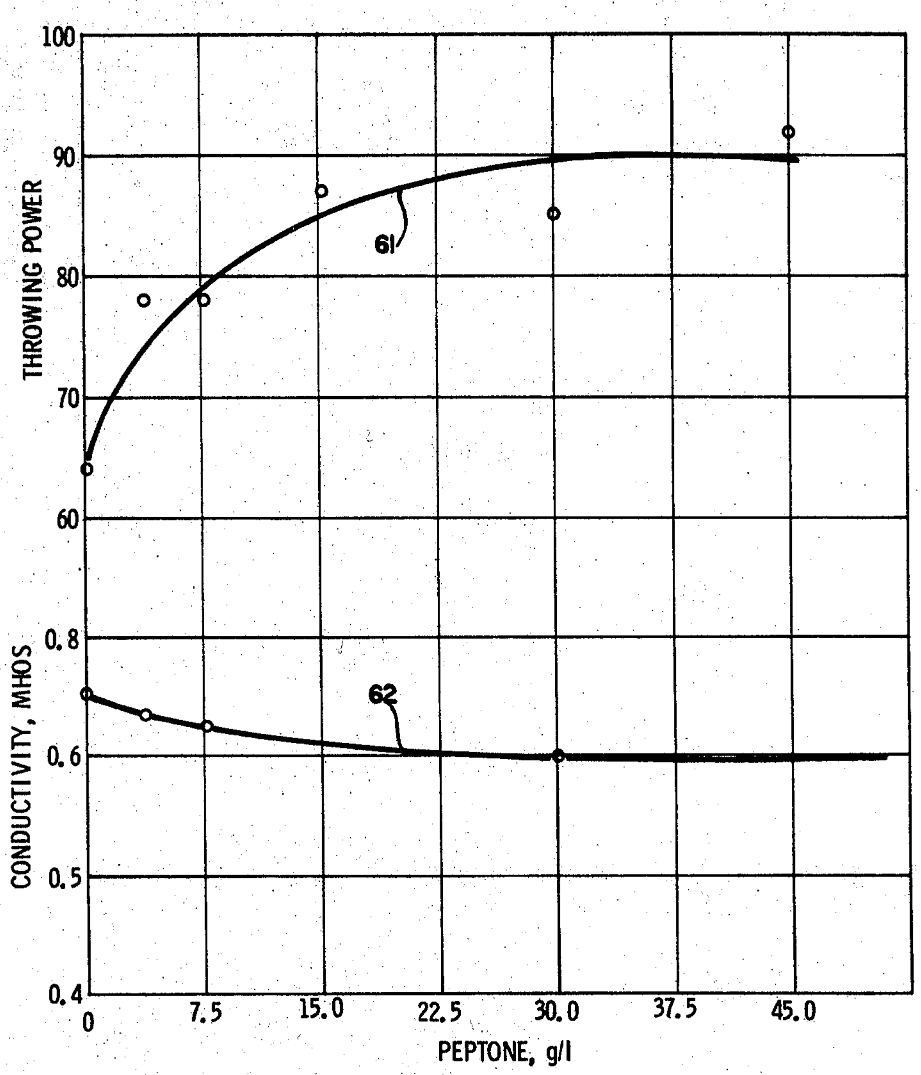
FIG. 6 is a graph of conductivity and throwing power as a function of peptone concentration in a solder plating bath.

The curves 61 and 62 of FIG. 6 respectively show the effect on throwing power and conductivity of a change in peptone concentration in the plating solution. With increasing peptone concentration, conductivity decreases but throwing power increases. The peptone increases the throwing power by favorably changing the cathodic polarization. Further, use of peptone helps to insure that the composition of the deposit will not vary with changes in current density. Alternatively, gelatin, resin or like materials could be substituted for the peptone in the inventive plating bath.

Various plating bath compositions within the recommended range of ingredients indicated in Table I above are typical by Examples II–IV listed hereinbelow. For each example the measured throwing power is indicated, as well as the preferred operating current range. Note that various tin-lead ratios are included among these examples. Experimental tests have indicated that changes of less than 1 percent in the deposited tin-lead solution ratio resulted from the changes in operating current within the ranges indicated.

TABLE II

| | Example | | |
|---|---|---|---|
| | II | III | IV |
| Tin, g./l. | 8.5 | 11.8 | 15 |
| Lead, g./l. | 8.5 | 5.2 | 10 |
| Total metal, g./l. | 17 | 17 | 25 |
| Fluoboric acid, g./l. | 450 | 450 | 500 |
| Boric acid, g./l. | | | 10 |
| Peptone, g./l. | 10 | 10 | 5 |
| Throwing power, g./l. | 80 | 80 | 70 |
| Current density range, a.s.f. | 15–20 | 15–20 | 15–20 |

Thus it will be appreciated that the inventive high throwing power plating solution permits tin-lead (solder) plating on multilayer boards or the like, the deposit providing excellent solderability due to the nearly constant composition near the solder eutectic point. Note that application of the inventive solder bath is not limited to plating of multilayer boards. Rather, the inventive high throwing power tin lead electrodeposition bath may be used to plate tin-lead alloys on items of any sort.

Although the invention has been described and illustrated in detail, it is to be clearly understood that the same is by way of illustration and example only and is not to be taken by way of limitation, the spirit and scope of this invention being limited only by the terms of the appended claims.

What is claimed is:

1. An aqueous acidic high throwing power tin-lead electrodeposition bath comprising, in combination:

| | G./l. |
|---|---|
| Tin ($Sn^{++}$) as fluoborate | 10–18 |
| Lead ($Pb^{++}$) as fluoborate | 5–12 |
| Free fluoboric acid | 300–500 |
| Peptone | 2–10 |

2. An aqueous acidic bath as defined in claim 1 further comprising boric acid in the range of 0 to 60 g./l. to control fluoborate hydrolysis.

3. A method for tin-lead plating through-holes in an electrical printed wiring board, said through-holes having conductive inner surfaces, said method comprising the steps of:

immersing said board in an aqueous acidic tin-lead plating bath comprising 10–18 g./l. tin ($Sn^{++}$) as fluoborate, 5–12 g./l. lead ($Pb^{++}$) as fluoborate, 300–500 g./l. free fluoboric acid and 2–30 g./l. peptone, and providing an electric current through said bath, said conductive inner surfaces serving as the cathode for said current, said current density being in the range of 10–25 amperes per square foot, thereby causing a substantially uniform layer of tin-lead to be deposited within said holes.

4. An aqueous acidic high throwing power tin-lead plating bath comprising a solution of lead fluoborate, tin fluoborate, and free fluoboric acid, in the range of from 300 to 500 grams per liter, the total lead and tin concentration of said bath being within the range of 15 to 30 grams per liter with said lead being present in a minimum concentration of about 5 grams per liter.

5. An aqueous acidic high throwing power tin-lead plating bath comprising a solution of lead fluoborate, tin fluoborate, and free fluoboric acid, in the range of from 300–500 grams per liter, the total lead and tin metal concentration of said bath being within the range of 15 to 30 grams per liter, with said lead being present in a minimum concentration of about 5 grams per liter, said plating bath further including peptone in the range of from 2 to 10 grams per liter.

References Cited

UNITED STATES PATENTS

| | | | |
|---|---|---|---|
| 1,527,577 | 2/1925 | Scott et al. | 204—54 |
| 2,421,079 | 5/1947 | Narcus | 204—54UX |

OTHER REFERENCES

Chemical Abstracts, vol. 53, 18698a (1959).

W. Blum et al.: Transactions of the Electrochemical Society, vol. 40, p. 296 (1921).

Metals Handbook, American Society for Metals, vol. 1, p. 1131, 8th ed. (1961).

GERALD L. KAPLAN, Primary Examiner

U.S. Cl. X.R.

204—43